United States Patent
Patapoutian

(12) 
(10) Patent No.: US 6,631,494 B2
(45) Date of Patent: Oct. 7, 2003

(54) AMELIORATING THE ADVERSE IMPACT OF BURST ERRORS ON THE OPERATION OF ISI DETECTORS

(75) Inventor: Ara Patapoutian, Westborough, MA (US)

(73) Assignee: Maxtor Corporation, Longmont, CO (US)

( * ) Notice: Subject to any disclaimer, the term of this patent is extended or adjusted under 35 U.S.C. 154(b) by 467 days.

(21) Appl. No.: 09/732,822

(22) Filed: Dec. 7, 2000

(65) Prior Publication Data

US 2002/0073377 A1 Jun. 13, 2002

(51) Int. Cl.[7] .............................................. H03M 13/00
(52) U.S. Cl. ........................................................ 714/788
(58) Field of Search ................................. 714/788, 786, 714/795, 796; 375/340, 341

(56) References Cited

U.S. PATENT DOCUMENTS 5,233,482 A     8/1993   Galbraith et al. ............. 360/46
5,889,823 A  *  3/1999   Agazzi et al. ............... 375/341
6,161,209 A  * 12/2000   Moher ......................... 714/780
6,405,342 B1 *  6/2002   Lee ............................. 714/792
6,438,180 B1 *  8/2002   Kavcic et al. ............... 275/341

* cited by examiner

*Primary Examiner*—Albert Decady
*Assistant Examiner*—Shelly A Chase
(74) *Attorney, Agent, or Firm*—Anthony L. Miele; Palmer & Dodge, LLP

(57) ABSTRACT

For iterative detection, an ISI decoder is provided to receive an input waveform comprising an input sequence of symbols and to output an intermediate waveform. The ISI decoder comprises a branch metric generation mechanism and a cost function update mechanism. A code decoder is provided to receive the intermediate waveform via a permutation path, to output an output waveform with the effects of ISI mitigated, and to output new information concerning the input waveform with less influence of the effects of ISI. The cost function update mechanism is adapted to receive branch metric information from the branch metric mechanism and to receive the new information via a repermutation path. A substitute mechanism is provided to substitute the branch metric information received by the cost function update mechanism with substitute information independent of the branch metric information when a given group of symbols of the input waveform are subject to a burst error.

25 Claims, 4 Drawing Sheets

AMELIORATING THE ADVERSE IMPACT OF BURST ERRORS ON THE OPERATION OF ISI DETECTORS

BACKGROUND

1. Field of the Invention

Aspects of the present invention relate to ISI detectors. Other aspects of the present invention may relate to a storage media read channel comprising an iterative decoder having an inter-symbol interference (ISI) detector.

2. Description of Background Information

Computer systems (e.g. personal computers, workstations, and the like) and intelligent devices (e.g., appliances and kiosk consumer electronic devices provided with microprocessors and micro controllers) are typically provided with a hierarchical memory system for handling the computer system's or device's long-term and short-term storage needs. Such memory hierarchies comprise primary (main) storage devices such as the computer's main memory (typically random access memory (RAM)) and secondary (auxiliary) storage devices such as disk drives (e.g., magnetic hard disk) and other external devices.

A memory system is provided which manages the exchange of data between the main memory and the auxiliary memory. As data is moved between the storage media and the auxiliary storage device, the data is transmitted over a read channel, which is susceptible to inter-symbol interference (ISI). ISI distorts the digital signal recovered from the storage media by temporally spreading and consequently overlapping the individual digital signals. As digital data transfer speed increases, the ISI affects on the communication over the read channel become more significant.

These ISI effects are due, in part, to the resistance and capacitance of the read channel. To mitigate against the effects of inter-symbol interference (ISI), read channels are typically provided with mechanisms that are called ISI decoders or detectors. Some of these decoders are iterative decoders (e.g., a turbo decoder), and some are not iterative (e.g., a Viterbi decoder). Iterative decoders and coders have attractive performance in environments containing random errors. However, when these coders and decoders are presented with burst errors (e.g. burst errors due to thermal asperity), those errors may be magnified at the output of the detector. For example, a 100 bit thermal asperity (TA) error may propagate to produce a more than 150 bit error at the output of the iterative detector.

Accordingly, there is a need for a mechanism to reduce these adverse affects of burst errors in iterative detectors, which can result in poor performance of auxiliary storage devices, such as hard disk drives.

FIG. 1 is a high-level block diagram of an iterative detector 100. A waveform 11 is input to an ISI decoder 10. ISI decoder 10 may comprise, for example, a BCJR detector or an SOVA (Soft Output Viterbi Algorithm) detector. ISI decoder 10 outputs probability bits which travel over permute path 12 and are input into a code decoder 14. Code decoder 14 may comprise, for example, a soft ECC decoder or a small ECC decoder. The output of code decoder 14 may be input into an optional ECC decoder 16. Code decoder 14 may comprise a turbo code decoder (convolutional code) or a low density parity code (LDPC) decoder.

Code decoder 14 provides additional knowledge/information which travels over the repermute path 18 and is input into ISI decoder 10. The data traveling over permute path 12 and traveling back over repermute path 18 will be forwarded back and forth until the resulting data converges, providing the desired output at the output of code decoder 14. Accordingly, a modified waveform will be provided to code decoder 14, which is absent ISI effects. Similarly, code decoder 14 processes the waveform by utilizing the code and ignoring the ISI effects. The code used may comprise a punctured recursive systematic convolutional code. The code decoder will output information which is not available through the waveform. This information comprises additional information which is sent back over repermute path 18, and accordingly is fed back into ISI decoder 10. In the second iteration, ISI decoder 10 uses both input waveform 11 and the additional information that traveled over repermute path 18. This decoding processing may stop after N interactions, where N<5 in some schemes.

When a burst error influences waveform 11, this causes the output of ISI decoder 10, which travels over permute path 12, to spread or leak the burst error (which, in the illustrated detector, comprises a TA error). After this error is processed by code decoder 14, it will produce additional information sent back over repermute path 18. This erroneous information will corrupt the information provided, and thereby prevent convergence of a desired output at the output of code decoder 14.

SUMMARY

The present invention is provided to improve upon iterative ISI detectors. Certain aspects of the present invention are provided to improve upon iterative detectors which remove ISI from a waveform being read from (or written to) a storage media, where the waveform is specifically a waveform that may be read from a hard disk and present on the read channel of the hard disk. In order to achieve one (or both) of these objectives, one or more aspects of the present invention may be followed in order to bring about one or more specific objects and advantages, as will be evident from the description which follows.

In one or more specific embodiments of the invention, the present invention may be directed to an iterative detector, a method for iterative detecting, or one or more subparts thereof, as well as to an article of manufacture, such as a computer-readable media encoded to facilitate the acts of such an apparatus or method. Such an iterative detector may be provided as part of a read channel of an auxiliary storage device. The auxiliary storage device may comprise a hard disk drive. In accordance with the implementation, an ISI decoder is provided to receive an input waveform comprising an input sequence of symbols and to output an intermediate waveform. The ISI decoder comprises a branch metric generation mechanism and a cost function update function mechanism. A code decoder is provided to receive the ISI free signal via a permutation path, to output an output data stream, with a more reliable data stream and to output new information concerning the input waveform with less influence of the effects of ISI. The cost function update mechanism is adapted to receive branch metric information from the branch metric mechanism and to receive the new information via a repermutation path. A substitute mechanism is provided to substitute the branch metric information received by the cost function update mechanism with substitute information independent of the branch metric information when a given group of symbols of the input waveform are subject to a burst error.

BRIEF DESCRIPTION OF THE DRAWINGS

The present invention is further described in the detailed description which follows, by reference to the noted plurality of drawings by way of non-limiting exemplary embodiments, in which like reference numerals represent similar parts throughout the several views of the drawings, and wherein.

DETAILED DESCRIPTION

Figure 1:
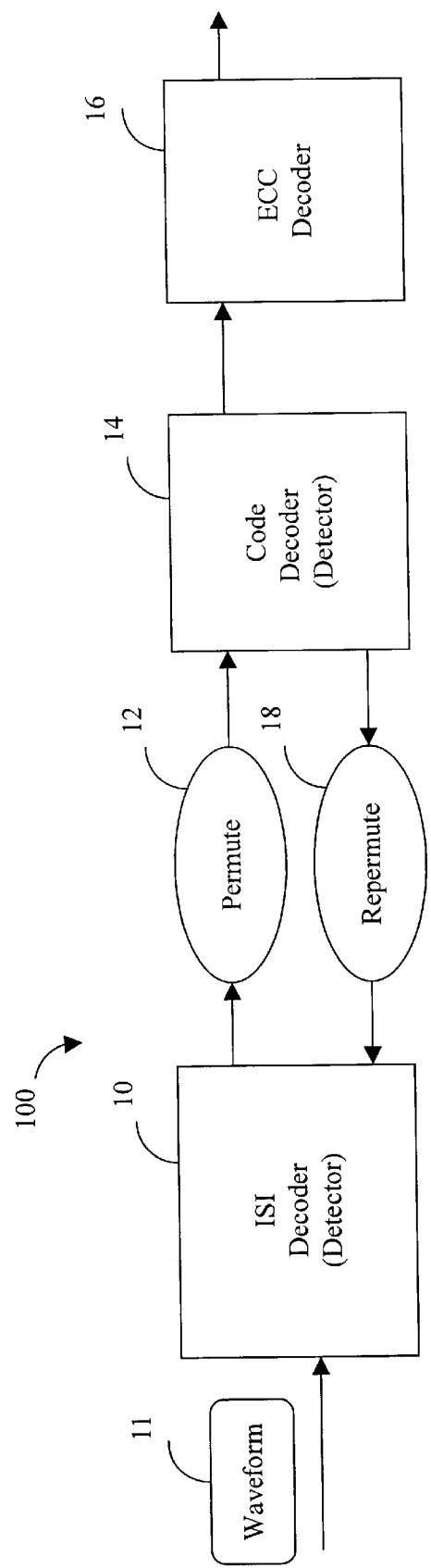
FIG. 1 illustrates a background art iterative detector.
Figure 2:
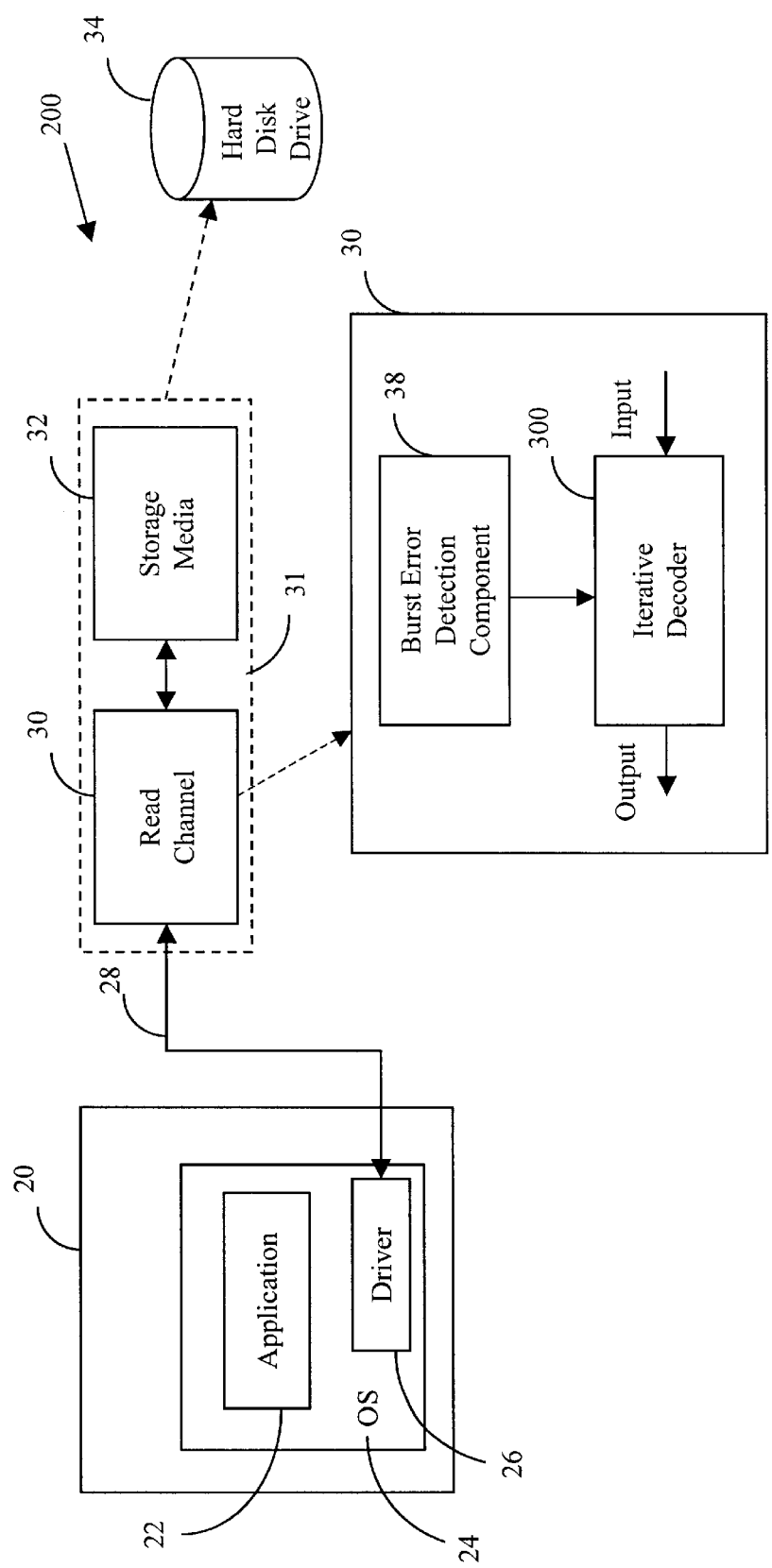
FIG. 2 is a block diagram of a computer system.

Referring now to the drawings in greater detail, FIG. 2 shows an illustrative computer system 200. Computer system 200 comprises a computer 20 and an auxiliary storage device 31, which are coupled to each other via an interface 28. The interface 28 may comprise a direct interface, such as a SCSI connection, or it may comprise a network connection. The connection may be over a very short distance, for example, where the auxiliary storage device 31 is directly connected to a SCSI bus provided within the same housing of computer 20, or it may be connected over an intermediate distance or over a long distance. In the illustrated embodiment, computer 20 comprises one or more applications 22, an operating system (OS) 24, and an auxiliary storage device driver 26. Auxiliary storage device 31 comprises a read channel 30 and a storage media 32. In the illustrated embodiment, auxiliary storage 31 comprises a hard disk drive 34.

Read channel 30 comprises, among other elements (not specifically shown), a burst error detection component 38 and an iterative decoder 300.

Read channel 30 may comprise a read channel of a hard disk drive. Detection component 38 may comprise analog circuitry that detects when a large spike occurs due to activity such as thermal asperity or other events which could cause burst errors, such as when the media has bumps thereon.

Figure 3:
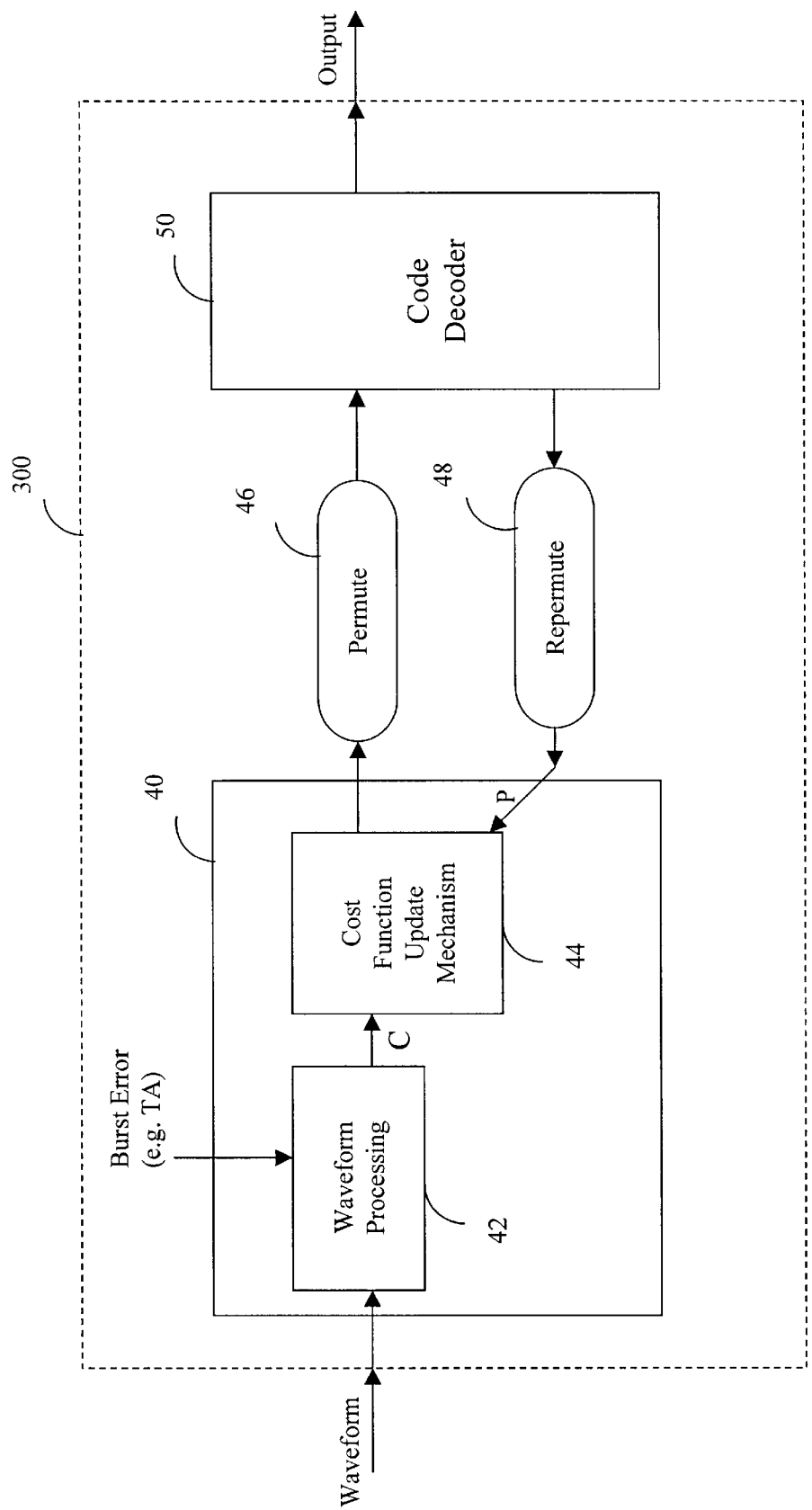
FIG. 3 is a block diagram of an iterative detector in accordance with an illustrated embodiment of the present invention.

FIG. 3 shows an iterative decoder 300 in accordance with an illustrated embodiment. The illustrated iterative decoder 300 comprises an ISI decoder 40, provided to receive an input waveform comprising an input sequence of symbols (i.e. a string of n bit symbols; e.g., a string of 32 six bit symbols). The illustrated ISI decoder 40 comprises a waveform processing mechanism 42 and a cost function update mechanism 44. A permute path 46 is provided which connects an output of cost function update mechanism 44 to an input of code decoder 50. A repermute path 48 takes new information produced by code decoder 50 and feeds that information back to cost function update mechanism 44. More specifically, cost function update mechanism 44 is adapted to receive branch metric information from waveform processing mechanism 42 and to receive the new information via the repermute path 48.

Figure 4:
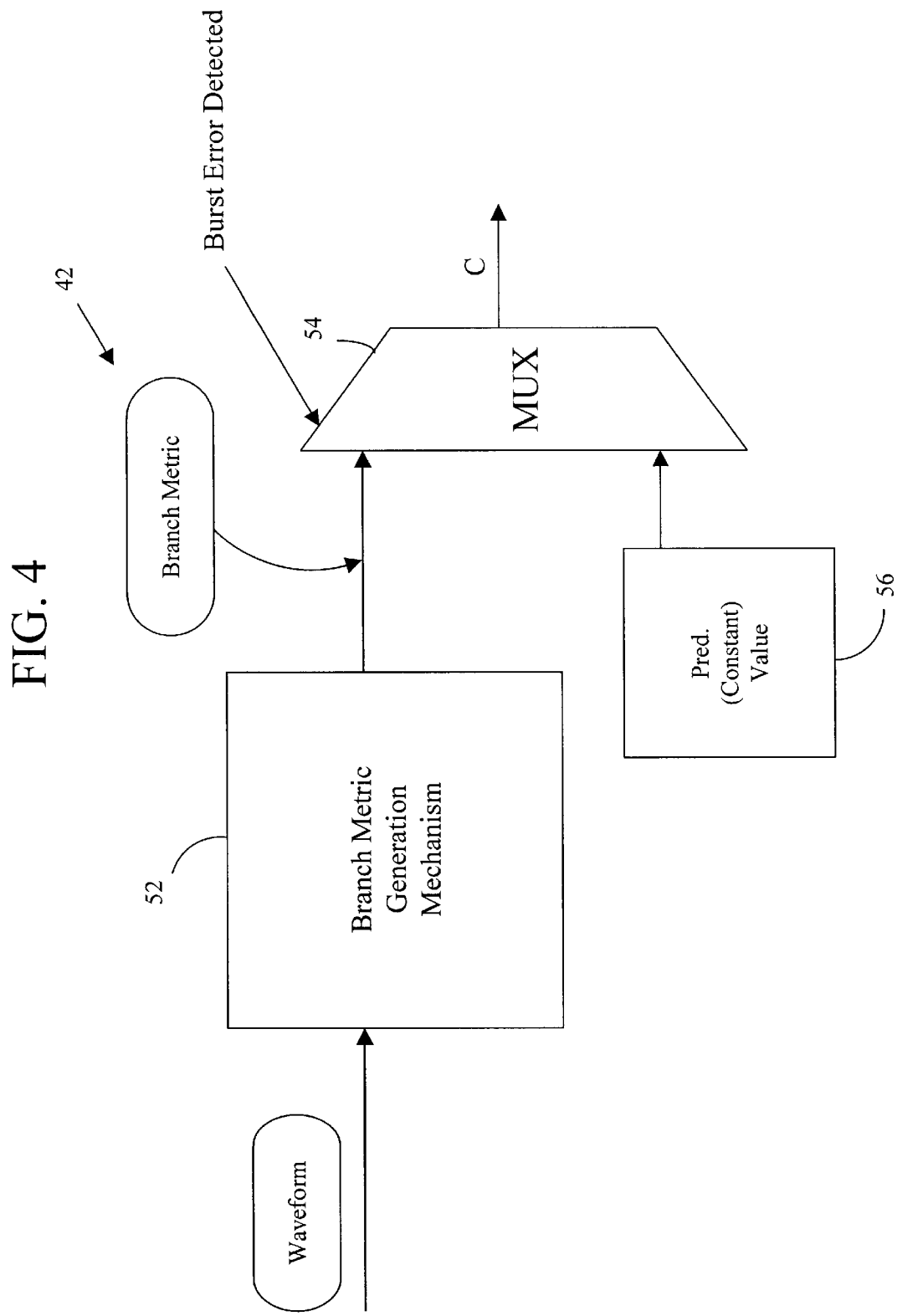
FIG. 4 is a block diagram of a waveform processing component of an ISI decoder in accordance the illustrated embodiment.

FIG. 4 shows a block diagram of waveform processing mechanism 42 in more detail. A branch metric generation mechanism 52 receives the input waveform and outputs branch metric information for the ISI component. A multiplexer 54 is provided which receives at its input the branch metric information along with substitute information 56, which comprises a predetermined constant value in the illustrated embodiment. When multiplexer 54 receives a signal indication that a burst error has been detected, it will output substitute information 56; otherwise, it will output the branch metric information.

ISI decoder 40 may be implemented consistent with the principals of the common BCJR (or forward backward detector), an SOVA (soft output Viterbi detector) or any simplification of such detectors. Code decoder 50 may comprise a turbo code (convolutional code) decoder, or an LDPC code (low-density parity code) decoder.

In the illustrated embodiment, one of two detector update schemes may be used. One such scheme is in accordance with the probability domain, while the other is in accordance with the log probability domain. In accordance with these schemes, the information output by multiplexer 54 is deemed channel information "c". Meanwhile, "p" represents the new information that is fed back through repermute path 48.

In an alpha update using the probability domain, a new intermediary cost function is calculated by cost function update mechanism 44 for a given iteration as follows:

$$\alpha = \alpha' p' c' + \alpha'' p'' c''$$

if Burst error $$c' = c'' = 1$$

In this equation, $\alpha'$ and $\alpha''$ represent the cost function of the states immediately preceding the present symbol location, that are connected to the present state. The $\alpha'$ and $\alpha''$ indications represent similar information corresponding to the p and c values. If there is a burst error, the values c' and c'' will be set to equal the substitute information, which in this specific embodiment is a constant value of 1. In this scheme, the value c can be anything except for 0. A value of 1 is preferred.

In the log probability domain scheme, a new cost function is calculated in accordance with the following equations.

$$\lambda' = \alpha' + p' + c'$$

$$\lambda' = \alpha'' + p'' + c''$$

$$\alpha = \log(e^{\lambda'} + e^{\lambda''}) \approx \max(e\lambda', e\lambda'')$$

If Burst error $$c' = c'' = 0$$

In this instance, c can be any value. In the specifically illustrated log probability domain detector update scheme, a value of c=0 is preferred.

The processing and functionality illustrated herein can be implemented in the form of special purpose hardware or in the form of software running on a general purpose computer. However, in the case of implementing the features as part of a read channel, for example, they may be implemented using ASIC (Application Specific Integrated Circuit) technology, as just one example.

For purposes of the disclosure herein, a computer-readable media may comprise any form of data storage mechanism, including such memory technologies including RAM or longer-term storage devices, such as magnetic disk, rewritable optical disk, and so on. A computer-readable media may also comprise hardware or circuit representations of information or data and the structures represented thereby.

While the invention has been described with reference to certain illustrated embodiments, the words which have been used herein are words of description rather than words of limitation. Changes may be made, within the purview of the appended claims, without departing from the scope and spirit of the invention in its aspects. Although the invention has been described herein with reference to particular structures, acts, and materials, the invention is not to be limited to the particulars disclosed, but rather extends to all equivalent structures, acts, and materials such as are within the scope of the appended claims.

What is claimed is:

1. An iterative detector comprising:
    an ISI decoder to receive an input waveform comprising an input sequence of symbols and to output an intermediate waveform, said ISI decoder comprising a branch metric generation mechanism and a cost function update mechanism;
    a code decoder to receive said intermediate waveform via a permutation path, to output an output waveform with the effects of ISI mitigated, and to output new information concerning said input waveform with less influence of the effects of ISI;
    said cost function update mechanism being adapted to receive branch metric information from said branch metric mechanism and to receive said new information via a repermutation path; and
    a substitute mechanism to substitute said branch metric information received by said cost function update mechanism with substitute information independent of said branch metric information when a given group of symbols of the input waveform is subject to a burst error.

2. A read channel of an auxiliary storage device comprising the iterative detector of claim 1.

3. The read channel according to claim 2, wherein said auxiliary storage device comprises a hard disk drive.

4. The read channel according to claim 3, wherein said ISI decoder comprises a BCJR decoder.

5. The read channel according to claim 3, wherein said ISI decoder comprises an SOVA decoder.

6. The read channel according to claim 3, wherein said branch metric generation mechanism comprises a lookup table.

7. The read channel according to claim 3, wherein said substitute mechanism comprises a multiplexer.

8. The read channel according to claim 7, wherein said multiplexer is configured to receive an indication that a given group of symbols of the input waveform is subject to a burst error.

9. The read channel according to claim 3, wherein said substitute information comprises a predetermined value.

10. The read channel according to claim 9, wherein said predetermined value comprises a predetermined constant value.

11. The read channel according to claim 10, wherein said burst error comprises a thermal asperity error.

12. The read channel according to claim 10, wherein said burst error comprises an error caused by media having bumps.

13. A method for performing iterative detection, said method comprising:
    an ISI decoder receiving an input waveform comprising an input sequence of symbols and outputting an intermediate waveform, said ISI decoder comprising a branch metric generation mechanism and a cost function update mechanism;
    a code decoder receiving said intermediate waveform via a permutation path, outputting an output waveform with the effects of ISI mitigated, and outputting new information concerning said input waveform with less influence of the effects of ISI;
    said cost function update mechanism receiving branch metric information from said branch metric mechanism and receiving said new information via a repermutation path; and
    a substitute mechanism substituting said branch metric information received by said cost function update mechanism with substitute information independent of said branch metric information when a given group of symbols of the input waveform is subject to a burst error.

14. The method according to claim 13, wherein the iterative detection is performed by a read channel of an auxiliary storage device.

15. The method according to claim 14, wherein the iterative detection is performed by a hard disk drive.

16. The method according to claim 15, wherein said ISI decoder comprises a BCJR decoder.

17. The method according to claim 15, wherein said ISI decoder comprises a SOVA decoder.

18. The method according to claim 15, wherein said branch metric generation mechanism comprises a lookup table.

19. The method according to claim 15, wherein said substitute mechanism comprises a multiplexer.

20. The method according to claim 19, further comprising providing said multiplexer with an indication that a given group of symbols of the input waveform is subject to a burst error.

21. The method according to claim 15, wherein said substitute information comprises a predetermined value.

22. The method according to claim 21, wherein said predetermined value comprises a predetermined constant value.

23. The method according to claim 22, wherein said burst error comprises a thermal asperity error.

24. The method according to claim 22, wherein said burst error comprises an error caused by media having bumps.

25. A computer-readable medium encoded with a program for performing iterative detection, said program comprising:
    an ISI decoder receiving an input waveform comprising an input sequence of symbols and outputting an intermediate waveform, said ISI decoder comprising a branch metric generation mechanism and a cost function update mechanism;
    a code decoder receiving said intermediate waveform via a permutation path, outputting an output waveform with the effects of ISI mitigated, and outputting new information concerning said input waveform with less influence of the effects of ISI;
    said cost function update mechanism receiving branch metric information from said branch metric mechanism and receiving said new information via a repermutation path; and
    a substitute mechanism substituting said branch metric information received by said cost function update mechanism with substitute information independent of said branch metric information when a given group of symbols of the inputted waveform is subject to a burst error.

* * * * *